US010733132B2

(12) United States Patent
Pelletier et al.

(10) Patent No.: US 10,733,132 B2
(45) Date of Patent: Aug. 4, 2020

(54) LOW SPEED BUS INTERFACE

(71) Applicant: HEWLETT PACKARD ENTERPRISE DEVELOPMENT LP, Houston, TX (US)

(72) Inventors: Eric Pelletier, Santa Cruz, CA (US); Boon Siang Choo, Iskandar Puteri (MY); Mohammadreza Rozehrezvani, Singapore (SG)

(73) Assignee: Hewlett Packard Enterprise Development LP, Houston, TX (US)

( * ) Notice: Subject to any disclaimer, the term of this patent is extended or adjusted under 35 U.S.C. 154(b) by 63 days.

(21) Appl. No.: 15/995,947

(22) Filed: Jun. 1, 2018

(65) Prior Publication Data

US 2019/0370205 A1  Dec. 5, 2019

(51) Int. Cl.
*G06F 13/40* (2006.01)
*G06F 13/42* (2006.01)
(Continued)

(52) U.S. Cl.
CPC ........ *G06F 13/4059* (2013.01); *G06F 13/105* (2013.01); *G06F 13/4295* (2013.01);
(Continued)

(58) Field of Classification Search
CPC ............... G06F 13/105; G06F 13/4059; G06F 13/4282; G06F 13/4295; G06F 30/34; G06F 2213/0058
See application file for complete search history.

(56) References Cited

U.S. PATENT DOCUMENTS 4,703,478 A * 10/1987 Haselton ................ H04Q 11/04
370/397
6,301,629 B1 10/2001 Sastri et al.
(Continued)

FOREIGN PATENT DOCUMENTS

CN            1507225        6/2004

OTHER PUBLICATIONS

Virtual definition from PC Magazine Encyclopedia [online]. Retrieved on Sep. 20, 2019 from the Internet: ,URL: https://www.pcmag.com/encyclopedia/term/53898/virtual>.*
(Continued)

*Primary Examiner* — Eric T Oberly
(74) *Attorney, Agent, or Firm* — Park, Vaughan, Fleming & Dowler LLP (57) ABSTRACT

Methods, apparatus, and systems for transferring data between a first and second module are provided. In one aspect, a method includes receiving, by a virtual controller register, outbound data; arbitrating, at a virtual arbitrate, the outbound data; transmitting, from the virtual controller register to the master low speed bus (LSB) frame/de-frame, the outbound data; adding, at the master LSB frame/de-frame, identification data to the outbound data to create an outbound data frame; transmitting, from the master LSB frame/de-frame to a slave LSB frame/de-frame, the outbound data frame; parsing, at the slave LSB frame/de-frame, the outbound data frame into parsed outbound data; arbitrating the parsed outbound data; transmitting, from the slave LSB frame/de-frame to the target controller register, the parsed outbound data; and receiving, at a target controller port from the target controller register, the parsed outbound data for transmitting to the slave device.

20 Claims, 4 Drawing Sheets

(51) Int. Cl.
  *G06F 13/10* (2006.01)
  *G06F 30/34* (2020.01)
(52) U.S. Cl.
  CPC .......... *G06F 13/4282* (2013.01); *G06F 30/34* (2020.01); *G06F 2213/0058* (2013.01)

(56) References Cited

U.S. PATENT DOCUMENTS

| | | | |
|---|---|---|---|
| 6,591,369 B1 | 7/2003 | Edwards et al. | |
| 7,337,241 B2 * | 2/2008 | Boucher | H04L 29/06 709/250 |
| 7,403,542 B1 * | 7/2008 | Thompson | H04L 69/16 370/389 |
| 2002/0161988 A1 | 10/2002 | Barlow et al. | |
| 2010/0188972 A1 * | 7/2010 | Knapp | H04L 12/43 370/226 |
| 2013/0182704 A1 * | 7/2013 | Jacobs | H04L 47/2441 370/357 |
| 2014/0133858 A1 * | 5/2014 | Fang | H04Q 11/0067 398/66 |
| 2015/0095534 A1 * | 4/2015 | O'Connor | G06F 13/4295 710/106 |
| 2017/0329737 A1 | 11/2017 | Barot et al. | |

OTHER PUBLICATIONS

The Serial Interface Unit Brings Powerful Functions and High Flexibility for TDM Data Applications on the XMC20 Platform, (Web Page), Retrieved Feb. 28, 2018, 3 Pgs.

\* cited by examiner

LOW SPEED BUS INTERFACE

BACKGROUND

In computer technology, data communication involves the transfer of data between, for example, a central processing unit (CPU) and one or more peripheral devices, components within a computer, or two computers. A communication interface, such as a bus, typically interfaces with a CPU and multiple peripheral devices, such as keyboards, printers, scanners, and monitors, to allow communication between the CPU and the peripheral devices. One conventional approach is to utilize multiple interfaces connected directly between the CPU and each peripheral device. Another conventional approach is to utilize multiple interfaces connected between the CPU and each component within a computer.

SUMMARY

The disclosed system provides for an interface that replaces multiple interfaces between master/slave modules. The disclosed interface includes a virtual collection of interfaces implemented on the master module and an actual collection of interfaces implemented on the slave module. The interface transfers data between the master module and the slave module via at least one wire regardless of the number of virtual interfaces.

According to certain aspects of the present disclosure, a method is provided. The method includes receiving, by a virtual controller register, outbound data. The method also includes arbitrating, at a virtual arbitrate module, the outbound data for transmitting to a master low speed bus frame/de-frame. The method also includes transmitting, from the virtual controller register to the master low speed bus frame/de-frame, the outbound data. The method also includes adding, at the master low speed bus frame/de-frame, identification data to the outbound data to create an outbound data frame. The method also includes transmitting, from the master low speed bus frame/de-frame to a slave low speed bus frame/de-frame, the outbound data frame. The method also includes parsing, at the slave low speed bus frame/de-frame, the outbound data frame into parsed outbound data. The method also includes arbitrating the parsed outbound data for transmitting to a target controller register. The method also includes transmitting, from the slave low speed bus frame/de-frame to the target controller register, the parsed outbound data. The method also includes receiving, at a target controller port from the target controller register, the parsed outbound data for transmitting to the slave device.

According to further aspects of the present disclosure, a system is provided. The system includes a first programmable logic device including a first memory including instructions. The first programmable logic device is configured to execute the instructions to receive outbound data. The first programmable logic device is also configured to execute the instructions to arbitrate, at a virtual arbitrate module of the first programmable logic device, the outbound data. The programmable logic device is also configured to execute the instructions to transmit, from the virtual controller register to a first low speed bus frame/de-frame of the first programmable logic device, the outbound data. The programmable logic device is also configured to execute the instructions to add, at the first low speed bus frame/de-frame, identification data to the outbound data to create an outbound data frame. The system also includes a second programmable logic device including a second memory including instructions. The second programmable logic device is configured to execute the instructions to receive, from the first low speed bus frame/de-frame at a second low speed bus frame/de-frame of the second programmable logic device, the outbound data frame. The second programmable logic device is also configured to execute the instructions to parse, at the second low speed bus frame/de-frame, the outbound data frame into parsed outbound data. The second programmable logic device is also configured to execute the instructions to arbitrate, at a target arbitrate module of the second programmable logic device, the parsed outbound data for transmitting to a target controller register. The second programmable logic device is also configured to execute the instructions to transmit, from the second low speed bus frame/de-frame to the target controller register, the parsed outbound data. The system also includes at least one wire coupling the first programmable logic device to the second programmable logic device.

According to further aspects of the present disclosure, an interface is provided. The interface includes a first field-programmable gate array including a first memory including instructions. The first field-programmable gate array is configured to execute the instructions to receive, at a virtual controller register of the field-programmable gate array, outbound data. The first field-programmable gate array is also configured to execute the instructions to arbitrate, at a virtual arbitrate module of the first field-programmable gate array, the outbound data. The first field-programmable gate array is also configured to execute the instructions to transmit, from the virtual controller register to a first low speed bus frame/de-frame of the first field-programmable gate array, the outbound data. The first field-programmable gate array is also configured to execute the instructions to add, at the first low speed bus frame/de-frame, identification data to the outbound data to create an outbound data frame. The identification data includes at least one of target controller register information, an outbound data frame type classification, an outbound data frame length tag, a logical instance for associating the outbound data frame to the target controller register, a transaction counter stamp, or an error code. The interface also includes a second field-programmable gate array including a second memory including instructions. The second field-programmable gate array is configured to execute the instructions to receive, from the first low speed bus frame/de-frame at a second low speed bus frame/de-frame of the second field-programmable gate array, the outbound data frame. The second field-programmable gate array is also configured to execute the instructions to parse, at the second low speed bus frame/de-frame, the outbound data frame into parsed outbound data, wherein the instruction to parse includes at least one of (1) detect the target controller register information, (2) detect the outbound data frame type classification, (3) detect the outbound data frame length, (4) detect the logical instance, (5) detect the transaction counter stamp, or (6) detect the error code.

According to further aspects of the present disclosure, a system is provided. The system includes a means for receiving outbound data. The system also includes a means for arbitrating the outbound data. The mean for receiving outbound data also transmits the outbound data. The system also includes a means for adding identification data to the outbound data to create an outbound data frame. The means for adding identification data also transmits the outbound data frame. The system also includes a means for parsing the outbound data frame into parsed outbound data. The system also includes a means for arbitrating the parsed outbound data. The means for parsing the outbound data frame also transmits the parsed outbound data. The system also includes a means for receiving the parsed outbound data for transmitting to a slave device.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

BRIEF DESCRIPTION OF THE DRAWINGS

The accompanying drawings, which are included to provide further understanding and are incorporated in and constitute a part of this specification, illustrate disclosed embodiments and together with the description serve to explain the principles of the disclosed embodiments. In the drawings.

In one or more implementations, not all of the depicted components in each figure may be required, and one or more implementations may include additional components not shown in a figure. Variations in the arrangement and type of the components may be made without departing from the scope of the subject disclosure. Additional components, different components, or fewer components may be utilized within the scope of the subject disclosure.

DETAILED DESCRIPTION

The detailed description set forth below is intended as a description of various implementations and is not intended to represent the only implementations in which the subject technology may be practiced. As those skilled in the art would realize, the described implementations may be modified in various different ways, all without departing from the scope of the present disclosure. Accordingly, the drawings and description are to be regarded as illustrative in nature and not restrictive.

The disclosed system provides an interface system including a virtual collection of interfaces implemented on a master module and an actual collection of interfaces implemented on a slave module.

The disclosed system addresses a technical problem tied to computer technology and arising in the realm of data processing, namely the technical problem that traditional interfaces may include high interconnect costs and unwieldy wire counts or may include a reduced wire count with complex, costly software. While traditional approaches that utilize multiple interfaces connected between the CPU and multiple component within a computer are relatively simple for software to manage, such approaches involve multiple wires for each interconnect, which increases the wire count as more components are implemented. Other conventional approaches that reduce the wire count, however, increase the complexity for software and, in turn, increases costs expenses because the software is not communicating directly with the components of the computer, but via specialized drivers to manage the data transfers. The disclosed system solves these technical problems by providing an interface that implements a virtual collection of interfaces in a first module and includes at least one wire, regardless of the number of virtual interfaces, in communication with a second module. With a limited number of wires, the disclosed system provides the technical benefit of reducing the signals between the first module and the second module. The disclosed system is also transparent to software executed by processors associated with the first module, as software only interfaces with individual virtual controllers and without requiring new drivers or code, providing another technical benefit.

In addition, unlike traditional interfaces, the disclosed interface provides the technical benefit of error protection to detect potential data transfer errors between the modules. The disclosed system also provides the technical benefit of scalability in terms of operating speed and supported virtual controllers such as supporting multiple copies of similar controllers as well as simultaneous support of different types of controllers at the same time. Moreover, the disclosed system provides the technical benefit of supporting multiple host access, for example, processors in each module are able to access the same set of target controllers. Additionally, the disclosed system provides an operating speed of approximately 10 Mbps, which can be scaled up accordingly to the physical medium (i.e., printed circuit board, cables) being implemented.

Figure 1:
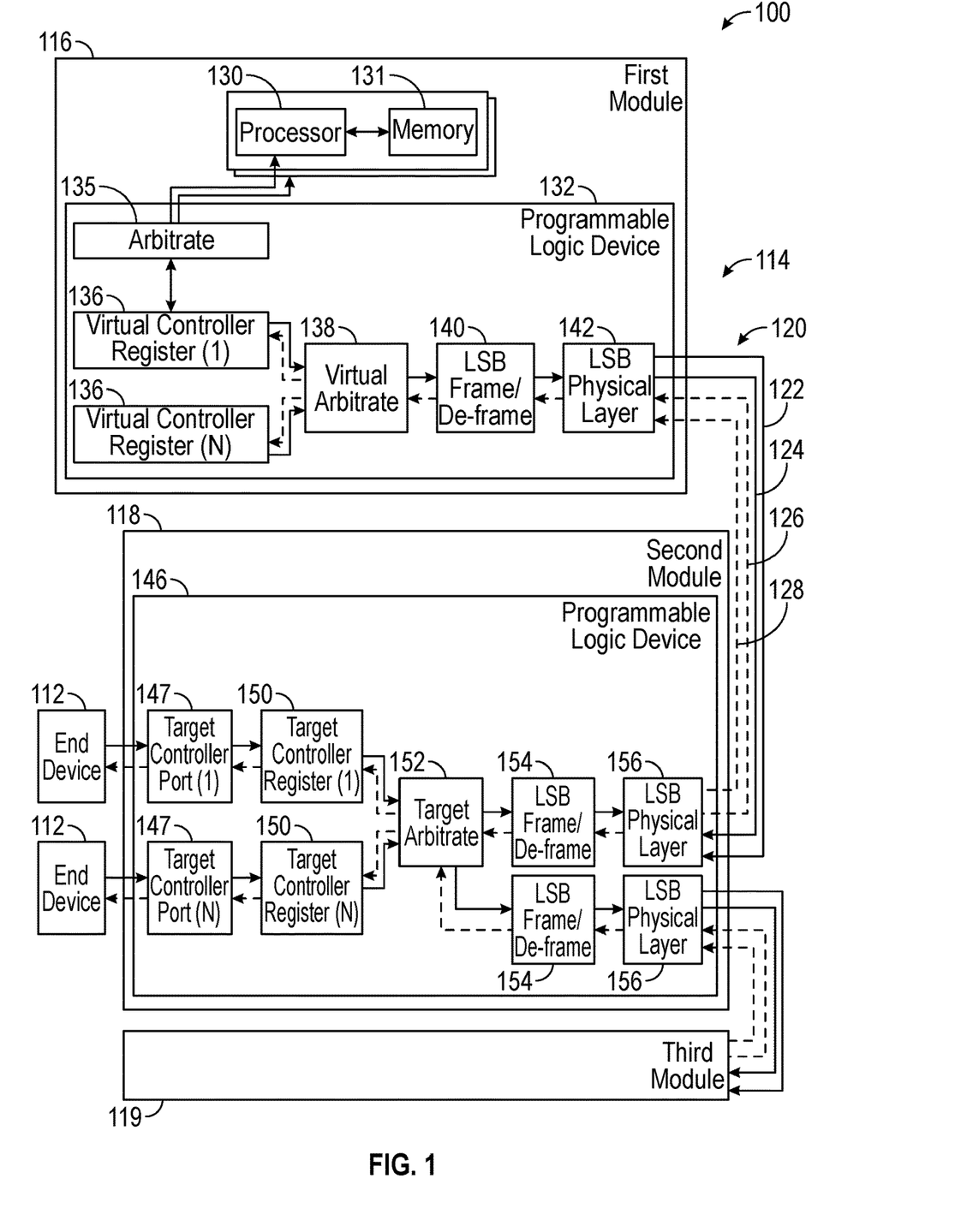
FIG. 1 is a block diagram illustrating an example interface system for transferring data in a communication system.

FIG. 1 illustrates an example communication system 100. The communication system 100 includes at least one end device 112, an interface 114, a first module 116, and a second module 118. In certain aspects, the first module 116 is in communication with at least one master device or processor (130), such as, for example, a central processing unit (CPU), and the end device 112 is, for example, a slave device such that data transfer is initiated on the master device. In such aspects, the end device 112 is a slave device such as, but not limited to, a sensor, a temperature sensor, a memory, a control, and a fan control. In yet other aspects, the end device 112 is capable of unidirectional data transfer to the master device such as interrupts, general-purpose input/output (GPIO) controls, and status data. In some aspects, the first module 116 is implemented on, for example, a Master Control Bridge (MCB) and the second module 118 is implemented on, for example, any of a Linecard Control Bridge (LCB), a Fabric-card Control Bridge (FCB), and an Infrastructure card Control Bridge (ICB).

At least one wire 120 couples the first module 116 to the second module 118. In certain aspects, the at least one wire 120 includes a first wire 122, a second wire 124, a third wire 126, and a fourth wire 128, where the first wire 122 is a TX-wire, the second wire 124 is a TX_SYNC-wire, the third wire 126 is an RX-wire, and the fourth wire 128 is a RX_SYNC-wire. Although the first module 116 and the second module 118 are described above as separate modules, it is to be understood that, in certain aspects, the first module 116 and the second module 118 are a unitary module including the components and operation of the first module 116 and the second module 118 combined.

The first module 116 includes at least one processor 130, at least one memory 131 corresponding to the at least one processor 130, and a programmable logic device 132. While the memory 131 is illustrated as a separate element in FIG. 1, it can be included in the processor 130 or in the programmable logic device 132. In some examples, memory 131 may include a storage drive (e.g., a hard drive), flash memory, Random Access Memory (RAM), Read Only Memory (ROM), Programmable Read-Only Memory (PROM), Erasable Prom (EPROM), registers, a hard disk, a removable disk, any type of storage disc (e.g., a Compact Disc Read Only Memory (CD-ROM), any other type of compact disc, a DVD, etc.) and the like, or a combination thereof. In some examples, processor 130 may be a general purpose microprocessor, a microcontroller, a Digital Signal Processor (DSP), and ASIC, an FPGA, a Programmable Logic Device (PLD), a controller, a state machine, gated logic, discrete hardware components, or any other suitable entity that can perform calculations or other manipulations of information.

In some examples, memory 131 may include a main memory and a secondary memory. The main memory may be where software may reside during runtime, such as a Random Access Memory. The secondary memory can, for example, include a non-volatile memory where a copy of software or other data is stored. Additionally, while memory 131 is illustrated as being one memory in FIG. 1, in some examples, memory 131 may include multiple memories. For example, memory 131 may include a memory that is used by processor 130 and a memory that is used by programmable logic device 132.

The programmable logic device 132 is any programmable logic device well-known in the industry including, but not limited to, a field-programmable gate array (FPGA), a complex programmable logic device (CPLD), and an application-specific integrated circuit (ASIC). While in some examples, the programmable logic device 132 includes a memory, such as the memory 131, and is configured to execute instructions stored in the memory, in other examples, the processor 130 is configured to implement and manage the programmable logic device 132 (e.g., by transferring instructions to the programmable logic device 132 via a serial interface, etc.).

The programmable logic device 132 includes an arbitrate 135, at least one virtual controller register 136, a virtual arbitrate 138, at least one low speed bus (LSB) frame/de-frame 140, and at least one LSB physical layer 142. In some examples, the programmable logic device 132 includes various circuits, logic blocks, hard blocks, which can implement the functionalities described herein in relation to the arbitrate 135, the virtual controller register 136, the virtual arbitrate 138, the LSB frame/de-frame 140, and the LSB physical layer 142, etc. For example, instructions stored in the memory 131 may allow for connections between the various circuits, logic blocks, hard blocks, etc. in the programmable logic block 132, and thus allow programmable logic device 132 to implement the arbitrate 135, the virtual controller register 136, the LSB frame/defame 140, and the LSB physical layer 142, etc. as described herein. Thus, in examples where the programmable logic device 132 is an FPGA, these instructions may serve to program or re-program the FPGA. The virtual controller register 136 simulates a register for industry controllers such as, but not limited to, Serial Peripheral Interface (SPI) and Inter-Integrated Circuit (I2C) controllers. For example, the virtual controller register 136 includes a status register including a busy-transmitter flag and a ready-to-receive-data-available flag. The virtual controller register 136 also includes, for example, a transmit register to transmit data in the outbound direction (indicated by the solid arrows in FIG. 1), i.e., write data destined to an outbound end device, such as the second end device 112, and a receive register to receive inbound data in the inbound direction (indicated by the dotted arrows in FIG. 1), i.e., read data delivered from the second end device 112, for example. In some embodiments, the virtual controller register 136 includes a control register for triggering a data push from the transmit register in the outbound direction to the second end device 112.

The arbitrate 135 is configured to arbitrate access to the virtual controller register 136 from, for example, the at least one processor 130 via an interface such as, for example, Peripheral Component Interconnect Express (PCIe) or SPI. As the outbound data is received by, or written into, the intended corresponding virtual controller register 136, the virtual arbitrate 138 is configured to determine and prioritize which outbound data to transmit to the LSB frame/de-frame 140. For example, the virtual controller register 136 supports multiple copies of similar controllers (e.g., multiple copies of I2C controllers) as well as simultaneously supports different types of controllers (e.g., I2C, SPI, RS-232, and CAN controllers) at the same time such that the outbound data is received in the intended corresponding virtual controller register 136 associated with that particular outbound data. The virtual arbitrate 138 is configured to implement any arbitration process well-known in the industry including, but not limited to, deficit round robin, weighted deficit round robin, prioritized selection, or any other arbitration process. In a similar fashion, the virtual arbitrate 138 is also configured to determine and prioritize inbound data (indicated by the dotted arrows in FIG. 1) to transmit from the LSB frame/de-frame 140 to the virtual controller register 136.

The LSB frame/de-frame 140 is configured to receive the outbound data from the virtual controller register 136 via the virtual arbitrate 138. In particular, after the virtual arbitrate 138 determines and selects the outbound data to be transmitted, the virtual controller register 136 transmits the outbound data to the LSB frame/de-frame 140 via the virtual arbitrate 138. The LSB frame/de-frame 140 is configured to add identification data, stored in memory, to the outbound data to create an outbound data frame. The identification data includes at least one of, but is not limited to, target controller register information, an outbound data frame type classification, an outbound data frame length tag, a logical instance, a transaction counter stamp, or an error code. The target controller register information includes information to locate the correct target controller register for where the outbound data is destined to be received. The outbound data frame type classification and the frame length tags include information to ensure the outbound data frame is appropriately recognized, parsed, and interpreted. The logical instance includes information for associating the outbound data frame to a specific target controller register. The transaction counter stamp includes information to provide order of transactions transmitted between the first module 116 and the second module 118 and determine if any transactions were not received at the second module 118. The error code includes an error code such as, but not limited to, a cyclic redundancy check (CRC) code for determining if any of the outbound data frame has been corrupted. The LSB frame/de-frame 140 is configured to transmit the outbound data frame to the second module 118 via the LSB physical layer 142 and the at least one wire 120, such as the first wire 122. The LSB physical layer 142 can be, for example, 8:10 encoded serializer/deserializer, Ethernet, or Peripheral Component Interconnect Express (PCIe) generations 1, 2, or 3.

The second module 118 includes a programmable logic device 146. The programmable logic device 146 is any programmable logic device well-known in the industry including, but not limited to, a field-programmable gate array (FPGA), a complex programmable logic device (CPLD), and an application-specific integrated circuit (ASIC). The programmable logic device 146 includes a memory and is configured to execute instructions stored in the memory. The interface 114 includes at least the programmable logic devices 132, 146, and the at least one wire 120.

The programmable logic device 146 includes at least one target controller port 147, at least one target controller register 150, a target arbitrate 152, at least one low speed bus (LSB) frame/de-frame 154, and at least one LSB physical layer 156. The programmable logic device 146 includes various circuits, logic blocks, hard blocks, which can be configured to implement the functionalities described herein in relation to the target controller port 147, the target controller register 150, the target arbitrate 152, the LSB frame/de-frame 154, and the LSB physical layer 156, etc. The LSB physical layers 142, 156 are configured to transmit and receive the data frames to/from the first module 116 and the second module 118. The LSB physical layer 156 can be, for example, 8:10 encoded serializer/deserializer, Ethernet, or Peripheral Component Interconnect Express (PCIe) generations 1, 2, or 3. The LSB physical layers 142, 156 are a symmetric communication medium which is, for example, capable of pushing data in either outbound or inbound directions. The LSB physical layers 142, 156 include sample/bit clock recovery and data framing capabilities, for example, capable of determining the beginning and end of a complete frame of data.

The LSB frame/de-frame 154 is configured to receive, via the at least one wire 120, such as the first wire 122, and the LSB physical layer 156, the outbound data frame from the LSB frame/de-frame 140. The LSB frame/de-frame 154 is configured to parse the outbound data frame and verify the identification data. For example, the LSB frame/de-frame 154 is configured to parse the outbound data frame into parsed outbound data as well as into the identification data including at least the target controller register information, the outbound data frame type classification, the outbound data frame length tag, the logical instance, the transaction counter stamp, or the error code. The LSB frame/de-frame 154 is configured to verify the error code. Based on a determination by the LSB frame/de-frame 154 that the error code is invalid, the LSB frame/de-frame 154 attempts to correct the error. If the error cannot be corrected, the LSB frame/de-frame 154 discards the outbound data frame and sets error counters and flags.

The LSB frame/de-frame 154 is also configured to verify the transaction counter stamp to determine if the current counter stamp is valid relative to a previous counter stamp. For example, a sequential wrap-around counter value is added to subsequent outbound data frames such that the LSB frame/de-frame 154 will expect the current counter stamp to be the next sequential value relative to the previous counter stamp. Based on a determination by the LSB frame/de-frame 154 that the transaction counter stamp is not the next sequential value expected (i.e., invalid) and the error code is invalid, the LSB frame/de-frame 154 discards the outbound data frame and sets a time stamp error counter. Based on a determination by the LSB frame/de-frame 154 that the transaction counter stamp is not the next sequential value expected (i.e., invalid) and the error code is valid, the LSB frame/de-frame 154 sets a time stamp error counter with markers, but does not discard the outbound data frame.

The LSB frame/de-frame 154 is also configured to verify the outbound data frame type classification and length tag to ensure the outbound data frame is properly recognized, parsed, and interpreted. Based on a determination by the LSB frame/de-frame 154 that the outbound data frame type classification and/or length tag are invalid and/or not recognized, the LSB frame/de-frame 154 sets error counters and flags.

The LSB frame/de-frame 154 is configured to verify the logical instance associated with the parsed outbound data, which notifies the target arbitrate 152 to direct the parsed outbound data to the appropriate corresponding next available target controller register 150.

In response to the identification data being determined valid, the LSB frame/de-frame 154 is also configured to transmit, along with the parsed outbound data, the target controller register information.

The target arbitrate 152 is configured to determine and prioritize which parsed outbound data in the LSB frame/de-frame 154 to transmit to at least one target controller register 150. The target arbitrate 152 is configured to implement any arbitration process well-known in the industry including, but not limited to, deficit round robin, weighted deficit round robin, prioritized selection, or any other arbitration process. In a similar fashion, the target arbitrate 152 is also configured to determine and prioritize inbound data (indicated by the dotted arrows in FIG. 1) to transmit from the target controller register 150 to the LSB frame/de-frame 154.

The target controller register 150 is configured to receive the parsed outbound data from the LSB frame/de-frame 154 via the target arbitrate 152. In particular, after the target arbitrate 152 determines and selects the parsed outbound data to be transmitted, the LSB frame/de-frame 154 transmits the parsed outbound data to the target controller register 150 via the target arbitrate 152. The target controller register 150 is configured to include a transmit register to transmit data, i.e., write the parsed outbound data, to the end device 112 via the controller port 147. The target controller register 150 is also configured to include a receive register to receive inbound data from the second end device 112 via the target controller port 147. The controller port 147 can be any type of port structure well-known in the industry such as, but not limited to, I2C, SPI, Management Data Input/Output (MDIO), and other port structures well-known in the industry.

Moreover, in the inbound direction, the LSB frame/de-frame 154 is configured to receive inbound data from the target controller register 150. In particular, after the target arbitrate 152 determines and selects the inbound data to be transmitted, the target controller register 150 transmits the inbound data to the LSB frame/de-frame 154. The LSB frame/de-frame 154 is configured to add identification data to the inbound data to create an inbound data frame. The identification data includes at least one of, but is not limited to, virtual controller register information, an inbound data frame type classification, an inbound data frame length tag, a logical instance, a transaction counter stamp, or an error code. The virtual controller register information includes information to locate the correct virtual controller register for where the inbound data is destined to be received. The inbound data frame type classification and the frame length tags include information to ensure the inbound data frame is appropriately recognized, parsed, and interpreted. The logical instance includes information for associating the inbound data frame to a virtual controller register. The transaction counter stamp includes information to provide order of transactions transmitted between the second module 118 and the first module 116 and determine if any transactions were not received at the first module 116. The error code includes an error code such as, but not limited to, a cyclic redundancy check (CRC) code for determining if any of the inbound data frame has been corrupted. The LSB frame/de-frame 154 is configured to transmit the inbound data frame to the first module 116 via the LSB physical layer 156 and the at least one wire 120, such as the third wire 126.

Furthermore, in the inbound direction, the LSB frame/de-frame 140 is configured to receive the inbound data frame from the LSB frame/de-frame 154 via the at least one wire 120 (such as the third wire 126) and the LSB physical layer 142. The LSB frame/de-frame 140 is configured to parse the inbound data frame and verify the identification data. For example, the LSB frame/de-frame 140 is configured to parse the inbound data frame into parsed inbound data as well as into the identification data including at least the virtual controller register information, the inbound data frame type classification, the inbound data frame length tag, the logical instance, the transaction counter stamp, or the error code. The LSB frame/de-frame 140 is configured to verify the error code. Based on a determination by the LSB frame/de-frame 140 that the error code is invalid, the LSB frame/de-frame 140 attempts to correct the error. If the error cannot be corrected, the LSB frame/de-frame 140 discards the outbound data frame and sets error counters and flags.

The LSB frame/de-frame 140 is also configured to verify the transaction counter stamp to determine if the current counter stamp is valid relative to a previous counter stamp. For example, a sequential wrap-around counter value is added to subsequent inbound data frames such that the LSB frame/de-frame 140 will expect the current counter stamp to be the next sequential value relative to the previous counter stamp. Based on a determination by the LSB frame/de-frame 140 that the transaction counter stamp is not the next sequential value (i.e., invalid) expected and the error code is invalid, the LSB frame/de-frame 140 discards the inbound data frame and sets a time stamp error counter. Based on a determination by the LSB frame/de-frame 140 that the transaction counter stamp is not the next sequential value expected (i.e., invalid) and the error code is valid, the LSB frame/de-frame 140 sets a time stamp error counter with markers, but does not discard the inbound data frame.

The LSB frame/de-frame 140 is also configured to verify the inbound data frame type classification and length tag to ensure the inbound data frame is properly recognized, parsed, and interpreted. Based on a determination by the LSB frame/de-frame 140 that the inbound data frame type classification and/or length tag are invalid and/or not recognized, the LSB frame/de-frame 140 sets error counters and flags.

The LSB frame/de-frame 140 is also configured to verify the logical instance associated with the parsed inbound data, which notifies the virtual arbitrate 138 to direct the parsed inbound data to the appropriate corresponding next available virtual controller register 136.

In response to the identification data being determined valid, the LSB frame/de-frame 140 is also configured to transmit, along with the parsed inbound data, the virtual controller register information.

While the above describes the first module 116 communicating with the second module 118, it is to be understood that more than one LSB frame/de-frame 140 and more than one LSB physical layer 142 can be included in the first module 116 and that more than one LSB frame/de-frame 154 and more than one LSB physical layer 156 can be included in the second module 116 such that either the first module 116 or the second module 118 is capable of communicating with more than one module, such as the second module 118 communicating with both the first module 116 and a third module 119 (illustrated in FIG. 1).

Figure 2:
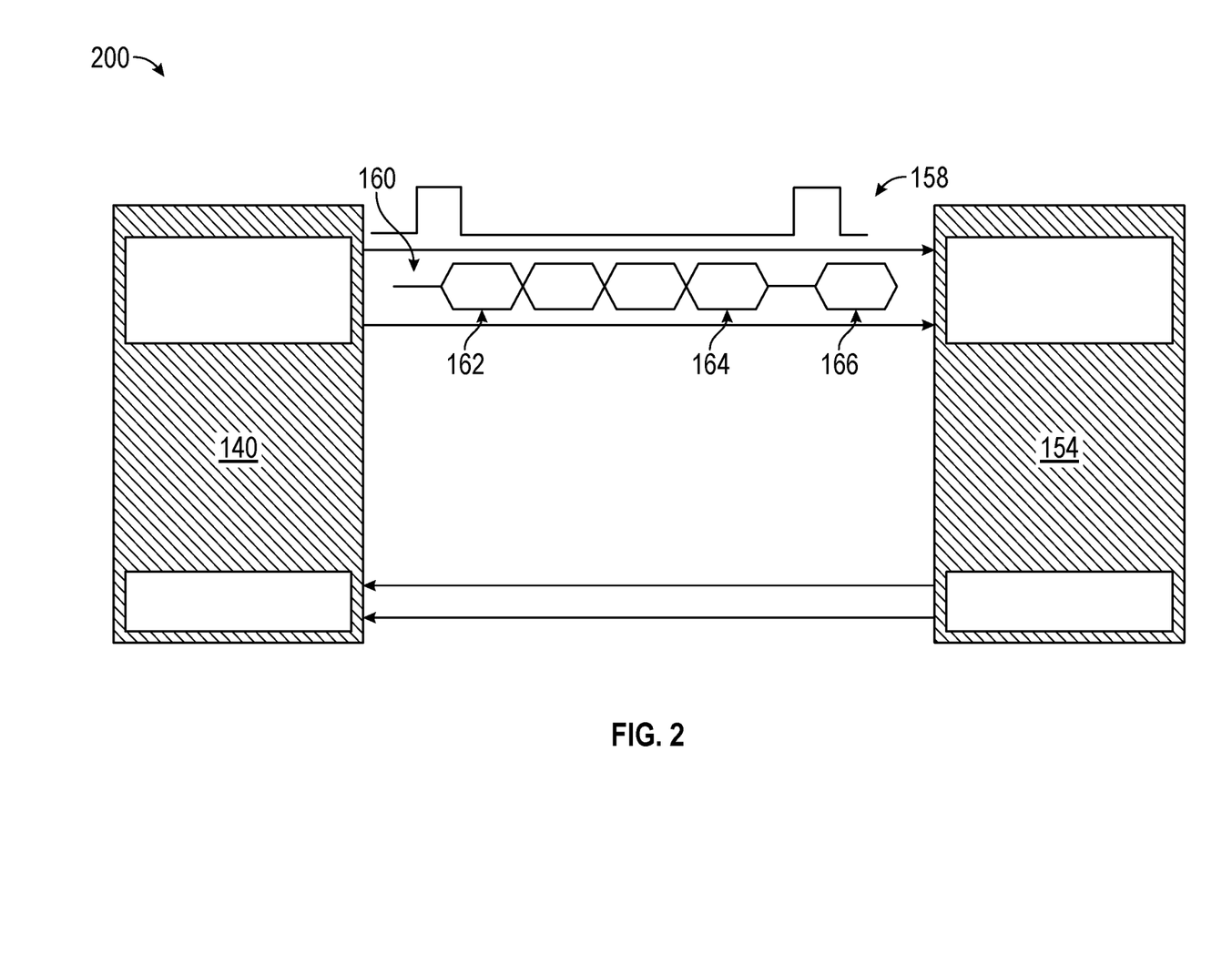
FIG. 2 is a timing diagram illustrating examples of synchronization pulses and respective data transferred between a first module and a second module of FIG. 1, according to certain aspects of the disclosure.

FIG. 2 is a timing diagram illustrating examples of synchronization pulses and respective data transferred between the LSB frame/de-frame 140 of the first module 116 and the LSB frame/de-frame 154 of the second module 118 of FIG. 1, according to certain aspects of the disclosure. The diagram 200 illustrates example synchronization pulses 158 and respective data 160, such as the outbound data frame. The synchronization pulses 158 are not sent out regularly, but are only sent to indicate the beginning of a new frame. As an example, a first bit and byte 162 of the outbound data frame and a last bit and byte 164 of the outbound data frame is transmitted between synchronization pulses 158 from the LSB frame/de-frame 140 to the LSB frame/de-frame 154. As such, a first bit and byte 166 of a next-in-line outbound data frame is transmitted at the next synchronization pulse.

Figure 3A:
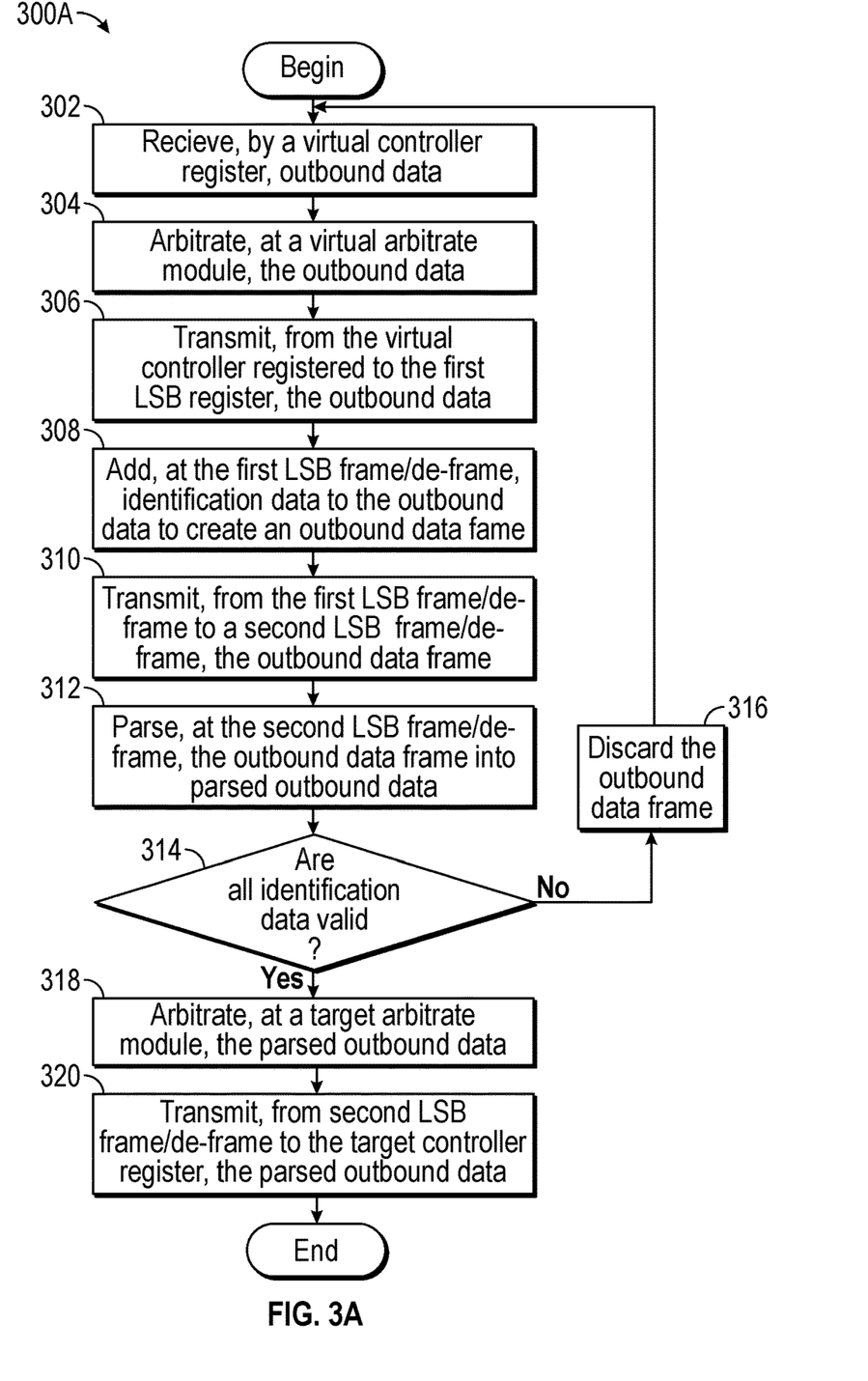
FIG. 3A illustrates an example process for transferring outbound data in the communication system, utilizing the interface system of FIG. 1.

FIG. 3A illustrates an example process 300A for transferring outbound data in the communication system utilizing the interface 114 of FIG. 1. While FIG. 3A is described with reference to FIG. 1, it should be noted that the process steps of FIG. 3A may be performed by other systems.

The process 300A begins by proceeding to step 302 when the virtual controller register 136 receives outbound data originated from the processor 130. Next in step 304, the virtual arbitrate 138 arbitrates (i.e., orders) the outbound data. At step 306, the virtual controller register 136 transmits the outbound data to the first LSB frame/de-frame 140. Moving to step 308, the first LSB frame/de-frame 140 adds identification data to the outbound data to create the outbound data frame. As depicted at step 310, the LSB frame/de-frame 140 transmits the outbound data frame to the LSB frame/de-frame 154. Next, in step 312, the LSB frame/de-frame 154 parses the outbound data frame into parsed outbound data. At step 314, the LSB frame/de-frame 154 verifies and determines if all of the identification data are valid. Based on a determination by the LSB frame/de-frame 154 that the answer is no and that one of the identification data is invalid, the process 300A proceeds to step 316 to discard the outbound data frame. After discarding the outbound data frame, the process 300A loops back to step 302. Based on a determination by the LSB frame/de-frame 154 that the answer is yes, then the process 300A proceeds to step 318. At step 318, the target arbitrate 152 arbitrates the parsed outbound data. The process 300A then proceeds to step 320 where the LSB frame/de-frame 154 transmits the parsed outbound data to the target controller register 150 and the process 300A ends.

As an example, the virtual controller register 136 receives, at its transmit register, the outbound data and sets the busy flag at its status register. The virtual controller register 136 clears the busy flag only when the target controller register 150 returns or transmits a completed-transaction flag to the virtual controller register 136 that corresponds to the outbound data that set the busy flag or when the target controller register 150 returns or transmits, to the virtual controller register 136, actual data (i.e., the inbound data) associated with a specific data request (i.e., the outbound data) that set the busy flag. The outbound data is then arbitrated at the virtual arbitrate 138 and, when the virtual arbitrate 138 determines order and prioritizes the outbound data to be transmitted, the virtual controller register 136 transmits the outbound data to the LSB frame/de-frame 140. At the LSB frame/de-frame 140, identification data is added to the outbound data to create the outbound data frame. After the outbound data frame is created, the LSB frame/de-frame 140 transmits the outbound data frame to the LSB frame/de-frame 154 via the LSB physical layers 142, 156, and the at least one wire 120, such as the first wire 122.

The LSB frame/de-frame 154 then parses the outbound data into parsed outbound data and verifies the identification data is valid. Based on a determination by the LSB frame/de-frame 154 that any one of the identification data is invalid, the LSB frame/de-frame 154 discards the outbound data frame and sets appropriate counters and flags. Based on a determination by the LSB frame/de-frame 154 that all of the identification data is valid, the parsed outbound data is arbitrated at the target arbitrate 152. When the target arbitrate 152 determines order and prioritizes the parsed outbound data to be transmitted, the LSB frame/de-frame 154 transmits the parsed outbound data to the target controller register 150. In certain aspects, the target controller register 150 then transmits the parsed outbound data to the second end device 112 via the target controller port 147.

Figure 3B:
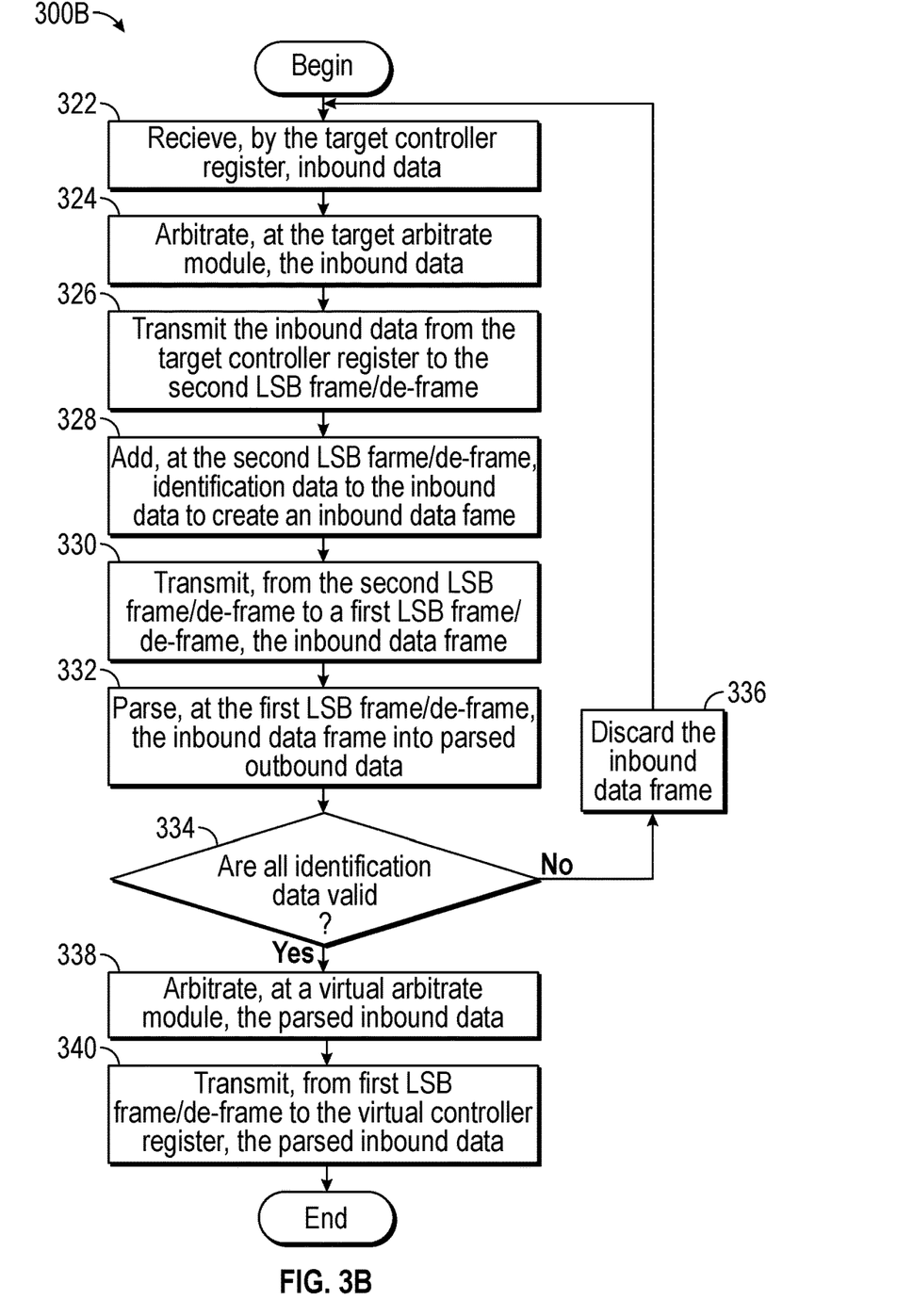
FIG. 3B illustrates an example process for transferring inbound data in the communication system, utilizing the interface system of FIG. 1.

FIG. 3B illustrates example process 300B for transferring inbound data in the communication system utilizing the interface 114 of FIG. 1. While FIG. 3B is described with reference to FIG. 1, it should be noted that the process steps of FIG. 3B may be performed by other systems.

The process 300B begins by proceeding to step 322 when the target controller register 150 receives inbound data from the second end device 112 via the target controller port 147. Next in step 324, the target arbitrate 152 arbitrates the inbound data at the target controller register 150. At step 326, the target controller register 150 transmits the inbound data to the second LSB frame/de-frame 154 via the target arbitrate 152. Moving to step 328, the second LSB frame/de-frame 154 adds identification data to the inbound data to create the inbound data frame. As depicted at step 330, the second LSB frame/de-frame 154 transmits the inbound data frame to the LSB frame/de-frame 140 via LSB physical layer 156 and at least one wire 120. Next, in step 332, the LSB frame/de-frame 140 parses the inbound data frame into parsed inbound data. At step 334, the LSB frame/de-frame 140 verifies and determines if all of the identification data are valid. Based on a determination by the LSB frame/de-frame 140 that the answer is no and that one of the identification data is invalid, the process 300B proceeds to step 336 to discard the inbound data frame. After discarding the inbound data frame, the process 300B loops back to step 322. On the other hand, based on a determination by the LSB frame/de-frame 140 that the answer is yes and that all of the identification data are valid, the process 300B proceeds to step 338. At step 338, the virtual arbitrate 138 arbitrates the parsed inbound data. The process 300B then proceeds to step 340 where the LSB frame/de-frame 140 transmits the parsed inbound data to the virtual controller register 136 and the process 300B ends.

As an example, the target controller register 150 receives the inbound data. The inbound data is then arbitrated at the target arbitrate 152 and, when the target arbitrate 152 determines order and prioritizes the inbound data to be transmitted, the target controller register 150 transmits the inbound data to the LSB frame/de-frame 154. At the LSB frame/de-frame 154, identification data is added to the inbound data to create the inbound data frame. After the inbound data frame is created, the LSB frame/de-frame 154 transmits the inbound data frame to the LSB frame/de-frame 140 via the LSB physical layer 142, 156, and the at least one wire 120, such as the third wire 126.

The LSB frame/de-frame 140 then parses the inbound data into parsed inbound data and verifies the identification data is valid. Based on a determination by the LSB frame/de-frame 140 that any one of the identification data is invalid, the LSB frame/de-frame 140 discards the inbound data frame and sets appropriate counters and flags. On the other hand, based on a determination by the LSB frame/de-frame 140 that all of the identification data is valid, the parsed inbound data is arbitrated at the virtual arbitrate 138. When the virtual arbitrate 138 determines order and prioritizes the parsed inbound data to be transmitted, the LSB frame/de-frame 140 transmits the parsed inbound data to the virtual controller register 136. In certain aspects, the virtual controller register 136 then transmits the parsed inbound data to the processor 130 via the arbitrate 135.

In one aspect, a method may be an operation, an instruction, or a function and vice versa. In one aspect, a clause or a claim may be amended to include some or all of the words (e.g., instructions, operations, functions, or components) recited in other one or more clauses, one or more words, one or more sentences, one or more phrases, one or more paragraphs, and/or one or more claims.

To illustrate the interchangeability of hardware and software, items such as the various illustrative blocks, modules, components, methods, operations, instructions, and algorithms have been described generally in terms of their functionality. Whether such functionality is implemented as hardware, software, or a combination of hardware and software depends upon the particular application and design constraints imposed on the overall system. Skilled artisans may implement the described functionality in varying ways for each particular application.

As used herein, the phrase "at least one of" preceding a series of items, with the terms "and" or "or" to separate any of the items, modifies the list as a whole, rather than each member of the list (e.g., each item). The phrase "at least one of" does not require selection of at least one item; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

Terms such as "top," "bottom," "front," "rear," and the like as used in this disclosure should be understood as referring to an arbitrary frame of reference, rather than to the ordinary gravitational frame of reference. Thus, a top surface, a bottom surface, a front surface, and a rear surface may extend upwardly, downwardly, diagonally, or horizontally in a gravitational frame of reference. Furthermore, to the extent that the term "include," "have," or the like is used in the description or the claims, such term is intended to be inclusive in a manner similar to the term "comprise" as "comprise" is interpreted when employed as a transitional word in a claim.

The word "exemplary" is used herein to mean "serving as an example, instance, or illustration." Any embodiment described herein as "exemplary" is not necessarily to be construed as preferred or advantageous over other embodiments. Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

A reference to an element in the singular is not intended to mean "one and only one" unless specifically stated, but rather "one or more." Pronouns in the masculine (e.g., his) include the feminine and neuter gender (e.g., her and its) and vice versa. The term "some" refers to one or more. Underlined and/or italicized headings and subheadings are used for convenience only, do not limit the subject technology, and are not referred to in connection with the interpretation of the description of the subject technology. Relational terms such as first and second and the like may be used to distinguish one entity or action from another without necessarily requiring or implying any actual such relationship or order between such entities or actions. All structural and functional equivalents to the elements of the various configurations described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description. No claim element is to be construed under the provisions of 35 U.S.C. § 112, sixth paragraph, unless the element is expressly recited using the phrase "means for" or, in the case of a method claim, the element is recited using the phrase "step for."

While this specification contains many specifics, these should not be construed as limitations on the scope of what may be claimed, but rather as descriptions of particular implementations of the subject matter. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

The subject matter of this specification has been described in terms of particular aspects, but other aspects can be implemented and are within the scope of the following claims. For example, while operations are depicted in the drawings in a particular order, this should not be understood as requiring that such operations be performed in the particular order shown or in sequential order, or that all illustrated operations be performed, to achieve desirable results. The actions recited in the claims can be performed in a different order and still achieve desirable results. As one example, the processes depicted in the accompanying figures do not necessarily require the particular order shown, or sequential order, to achieve desirable results. In certain circumstances, multitasking and parallel processing may be advantageous. Moreover, the separation of various system components in the aspects described above should not be understood as requiring such separation in all aspects, and it should be understood that the described program components and systems can generally be integrated together in a single software product or packaged into multiple software products.

The title, background, brief description of the drawings, abstract, and drawings are hereby incorporated into the disclosure and are provided as illustrative examples of the disclosure, not as restrictive descriptions. It is submitted with the understanding that they will not be used to limit the scope or meaning of the claims. In addition, in the detailed description, it can be seen that the description provides illustrative examples and the various features are grouped together in various implementations for the purpose of streamlining the disclosure. The method of disclosure is not to be interpreted as reflecting an intention that the claimed subject matter requires more features than are expressly recited in each claim. Rather, as the claims reflect, inventive subject matter lies in less than all features of a single disclosed configuration or operation. The claims are hereby incorporated into the detailed description, with each claim standing on its own as a separately claimed subject matter.

The claims are not intended to be limited to the aspects described herein, but are to be accorded the full scope consistent with the language claims and to encompass all legal equivalents. Notwithstanding, none of the claims are intended to embrace subject matter that fails to satisfy the requirements of the applicable patent law, nor should they be interpreted in such a way.

What is claimed is:

1. A method for transferring data between a master device and a slave device, the method comprising:
   receiving, at a first interface module comprising a set of virtual controller registers, outbound data, wherein a respective virtual controller register is configured to simulate a register for a controller of a predetermined physical interface;
   selecting, from the set of virtual controller registers, a particular virtual controller register for receiving the outbound data;
   arbitrating, at a virtual arbitrate, the outbound data for transmitting to a master low speed bus frame/de-frame residing on the first interface module;
   transmitting, from the particular virtual controller register to the master low speed bus frame/de-frame, the outbound data;
   adding, at the master low speed bus frame/de-frame, identification data to the outbound data to create an outbound data frame;
   transmitting, from the master low speed bus frame/de-frame to a slave low speed bus frame/de-frame residing on a separate second interface module, the outbound data frame, wherein the separate second interface module comprises a set of target controller registers;
   parsing, at the slave low speed bus frame/de-frame, the outbound data frame into parsed outbound data;
   arbitrating, at a target arbitrate, the parsed outbound data for transmitting;
   selecting, from the set of target controller registers, a particular target controller register for receiving the outbound data based on the identification data;
   transmitting, from the slave low speed bus frame/de-frame to the particular target controller register, the parsed outbound data; and receiving, at a target controller port from the particular target controller register, the parsed outbound data for transmitting to the slave device.

2. The method of claim 1, wherein arbitrating the outbound data comprises determining, at a virtual arbitrate, a prioritization of the outbound data for transmitting to the master low speed bus frame/de-frame.

3. The method of claim 2, wherein transmitting the outbound data comprises setting a busy flag.

4. The method of claim 1, wherein transmitting, from the master low speed bus frame/de-frame to the slave low speed bus frame/de-frame, the outbound data frame comprises transmitting the outbound data frame via at least one wire.

5. The method of claim 1, wherein the identification data comprises at least one of target controller register information, an outbound data frame type classification, an outbound data frame length tag, a logical instance for associating the outbound data frame to the target controller register, a transaction counter stamp, or an error code.

6. The method of claim 5, wherein the identification data comprises the error code, and wherein parsing the outbound data frame comprises verifying the error code is correct.

7. The method of claim 5, wherein the identification data comprises the transaction counter stamp, and wherein parsing the outbound data frame comprises verifying the transaction counter stamp is valid.

8. The method of claim 5, wherein the identification data comprises the outbound data frame type classification and the outbound data frame length, and wherein parsing the outbound data frame comprises verifying the outbound data frame type classification and the outbound data frame length tag are valid.

9. The method of claim 5, wherein parsing the outbound data frame comprises identifying a corresponding target controller register, via the logical instance, for receiving the parsed outbound data.

10. The method of claim 1, wherein arbitrating the parsed outbound data comprises determining, at a target arbitrate, a prioritization of the parsed outbound data for transmitting to the target controller register.

11. A system comprising:
a first programmable logic device comprising a first memory comprising instructions, wherein the first programmable logic device is configured to execute the instructions to:
  receive, at the first programmable logic device, outbound data, wherein the first programmable logic device comprises a set of virtual controller registers, and wherein a respective virtual controller register is configured to simulate a register for a controller of a predetermined physical interface;
  selecting, from the set of virtual controller registers, a particular virtual control register for receiving the outbound data;
  arbitrate, at a virtual arbitrate of the first programmable logic device, the outbound data;
  transmit, from the particular virtual controller register to a first low speed bus frame/de-frame of the first programmable logic device, the outbound data; and
  add, at the first low speed bus frame/de-frame, identification data to the outbound data to create an outbound data frame;
a separate second programmable logic device comprising a second memory, wherein the second programmable logic device is configured to execute the instructions to:
  receive, from the first low speed bus frame/de-frame at a second low speed bus frame/de-frame of the second programmable logic device, the outbound data frame, wherein the separate second programmable logic device comprises a set of target controller registers;
  parse, at the second low speed bus frame/de-frame, the outbound data frame into parsed outbound data;
  arbitrate, at a target arbitrate of the second programmable logic device, the parsed outbound data for transmitting;
  selecting, from the set of target controller registers, a particular target controller register for receiving the outbound data based on the identification data; and
  transmit, from the second low speed bus frame/de-frame to the particular target controller register, the parsed outbound data; and
at least one wire coupling the first programmable logic device to the second programmable logic device.

12. The system of claim 11, wherein the second programmable logic device is configured to execute the instructions to:
  receive, at the target controller register, inbound data;
  arbitrate, at the target arbitrate, the inbound data;
  transmit, from the target controller register to the second low speed bus frame/de-frame, the inbound data; and
  add, at the second low speed bus frame/de-frame, identification data to the inbound data to create an inbound data frame.

13. The system of claim 12, wherein the first programmable logic device is configured to execute the instructions to:
  receive, from the second low speed bus frame/de-frame at the first low speed bus frame/de-frame, the inbound data frame;
  parse, at the first low speed bus frame/de-frame, the inbound data frame into parsed inbound data;
  arbitrate, at the virtual arbitrate, the parsed inbound data for transmitting to the virtual controller register; and
  transmit, from the first low speed bus frame/de-frame to the virtual controller register, the parsed inbound data.

14. The system of claim 13, wherein the second programmable logic device is configured to execute instructions to receive, from the first low speed bus frame/de-frame at the second low speed bus frame/de-frame of the second programmable logic device, the outbound data via the at least one wire.

15. The system of claim 14, wherein the first programmable logic device is configured to execute instructions to receive, from the second low speed bus frame/de-frame at the first low speed bus frame/de-frame, the inbound data frame via the at least one wire.

16. The system of claim 11, wherein the first programmable logic device and the second programmable logic device are field-programmable gate arrays.

17. An interface, comprising:
a first field-programmable gate array comprising a first memory comprising instructions, wherein the first field-programmable gate array is configured to execute the instructions to:
  receive, at the first field-programmable gate array, outbound data, wherein the first field-programmable gate array comprises a set of virtual controller registers, and wherein a respective virtual controller register is configured to simulate a register for a controller of a predetermined physical interface;
  selecting, from the set of virtual controller registers, a particular virtual control register for receiving the outbound data;

arbitrate, at a virtual arbitrate of the first field-programmable gate array, the outbound data;

transmit, from the particular virtual controller register to a first low speed bus frame/de-frame of the first field-programmable gate array, the outbound data; and add, at the first low speed bus frame/de-frame, identification data to the outbound data to create an outbound data frame, wherein the identification data comprises at least one of target controller register information, an outbound data frame type classification, a length tag, a logical instance for associating the outbound data frame to a target controller register, a transaction counter stamp, or an error code; and a separate second field-programmable gate array comprising a second memory comprising instructions, wherein the second field-programmable gate array is configured to execute the instructions to:

receive, from the first low speed bus frame/de-frame at a second low speed bus frame/de-frame of the second field-programmable gate array, the outbound data frame, wherein the separate second field-programmable gate array comprises a set of target controller registers;

parse, at the second low speed bus frame/de-frame, the outbound data frame into parsed outbound data, wherein the instruction to parse comprises at least one of (1) detect the target controller register information, (2) detect the outbound data frame type classification, (3) detect the outbound data frame length, (4) detect the logical instance, (5) detect the transaction counter stamp, or (6) detect the error code;

select, from the set of target controller registers, a particular target controller register for receiving the outbound data based on the identification data; and transmit, from the second low speed bus frame/de-frame to the particular target controller register, the parsed outbound data.

18. The interface of claim 17, wherein the second field-programmable gate array is configured to execute the instructions to:

determine, at the second low speed bus frame/de-frame, the error code is valid; and arbitrate, at a target arbitrate of the second field-programmable gate array, the parsed outbound data for transmitting to a target controller register.

19. The interface of claim 17, wherein the second field-programmable gate array is configured to execute the instructions to:

determine, at the second low speed bus frame/de-frame, the error code is invalid;

discard the outbound data frame; and set an error flag and an error counter.

20. The interface of claim 17, wherein the second field-programmable gate array is configured to execute the instructions to:

determine, at the second low speed bus frame/de-frame, the transaction counter stamp is invalid;

discard the outbound data frame; and set a time stamp error counter.

* * * * *